(12) United States Patent
Rolfson et al.

(10) Patent No.: US 6,340,834 B1
(45) Date of Patent: *Jan. 22, 2002

(54) METHOD OF MAKING A RESISTOR, METHOD OF MAKING A DIODE, AND SRAM CIRCUITRY AND OTHER INTEGRATED CIRCUITRY

(75) Inventors: J. Brett Rolfson; Monte Manning, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,992

(22) Filed: Jun. 29, 1998

Related U.S. Application Data (60) Continuation of application No. 08/692,043, filed on Aug. 1, 1996, now Pat. No. 5,825,074, which is a division of application No. 08/528,124, filed on Sep. 14, 1995, now Pat. No. 5,567,644.

(51) Int. Cl.⁷ .............................................. H01L 29/00
(52) U.S. Cl. ....................................... 257/538; 257/904
(58) Field of Search ................................. 257/538, 904

(56) References Cited

U.S. PATENT DOCUMENTS

| | | | |
|---|---|---|---|
| 4,406,051 A | 9/1983 | Iizuka | 29/576 |
| 4,411,708 A | 10/1983 | Winhan | 148/1.5 |
| 4,702,937 A | 10/1987 | Yamoto et al. | 437/233 |
| 4,727,045 A | 2/1988 | Cheung et al. | 437/47 |
| 4,829,024 A | 5/1989 | Klein et al. | 437/189 |
| 4,933,739 A | 6/1990 | Harari | 257/538 |
| 4,968,645 A | 11/1990 | Baldi et al. | 437/200 |
| 5,066,605 A | 11/1991 | Kasper et al. | 437/51 |
| 5,159,430 A | 10/1992 | Manning et al. | 257/904 |
| 5,177,030 A | 1/1993 | Lee et al. | 437/47 |
| 5,187,114 A | 2/1993 | Chan et al. | 437/52 |
| 5,241,206 A | 8/1993 | Lee et al. | 257/536 |
| 5,398,200 A | 3/1995 | Mazure et al. | 257/904 |
| 5,474,948 A | 12/1995 | Yamazaki | 437/60 |
| 5,489,796 A | 2/1996 | Harward | 257/379 |
| 5,521,401 A | 5/1996 | Zamanian et al. | 257/366 |
| 5,536,960 A | 7/1996 | Hayashi | 257/903 |
| 5,554,554 A | 9/1996 | Bastani et al. | 437/47 |
| 5,567,644 A | 10/1996 | Rolfson et al. | 437/60 |
| 5,578,854 A | * 11/1996 | Chen et al. | 257/349 |
| 5,589,418 A | 12/1996 | Kalnitsky | 438/384 |
| 5,602,408 A | 2/1997 | Watanabe et al. | 257/538 |
| 5,629,240 A | 5/1997 | Malladi et al. | 438/106 |
| 5,641,991 A | 6/1997 | Sakoh | 257/755 |

(List continued on next page.)

FOREIGN PATENT DOCUMENTS

| | | | |
|---|---|---|---|
| JP | 63-141360 | 6/1988 | 257/538 |
| JP | 1-91472 A | 1/1989 | |

OTHER PUBLICATIONS

S. Wolf et al., "Silicon Processing for the VLSI Era", vol. 1—Process Technology, 1986, pp. 137–138, 189–191.

*Primary Examiner*—Mark V. Prenty
(74) *Attorney, Agent, or Firm*—Wells, St. John, Roberts, Gregory & Matkin, P.S.

(57) ABSTRACT

Disclosed are methods of forming resistors and diodes from semiconductive material, and static random access memory (SRAM) cells incorporating resistors, and to integrated circuitry incorporating resistors and diodes. A node to which electrical connection is to be made is provided. An electrically insulative layer is provided outwardly of the node. An opening is provided in the electrically insulative layer over the node. The opening is filled with semiconductive material which depending on configuration serves as one or both of a vertically elongated diode and resistor.

30 Claims, 2 Drawing Sheets

U.S. PATENT DOCUMENTS

| | | | |
|---|---|---|---|
| 5,668,037 A | 9/1997 | Prall et al. | 438/238 |
| 5,683,930 A | 11/1997 | Batra et al. | 257/538 |
| 5,732,023 A | 3/1998 | Roberts | 257/536 |
| 5,770,496 A | 6/1998 | Roberts | 438/238 |
| 5,825,074 A | 10/1998 | Rolfson et al. | 257/536 |
| 5,831,276 A | 11/1998 | Gonzales et al. | 257/3 |
| 5,867,087 A * | 2/1999 | Wuu et al. | 257/538 |
| 5,892,292 A | 4/1999 | Easter | 257/913 |
| 5,930,662 A | 7/1999 | Manning | 438/238 |
| 5,998,276 A | 12/1999 | Batra et al. | 438/382 |
| 6,008,082 A * | 12/1999 | Rolfson et al. | 438/238 |
| 6,043,117 A | 3/2000 | Batra et al. | 438/238 |
| 6,093,596 A | 7/2000 | Rolfson et al. | 438/238 |
| 6,204,110 B1 | 3/2001 | Roberts | 438/238 |

* cited by examiner

METHOD OF MAKING A RESISTOR, METHOD OF MAKING A DIODE, AND SRAM CIRCUITRY AND OTHER INTEGRATED CIRCUITRY

This patent resulted from a continuation application of U.S. patent application Ser. No. 08/692,043, filed Aug. 1, 1996, entitled "A Method of Making a Resistor, Method of Making a Diode, and SRAM Circuitry and Other Integrated Circuitry", naming J. Brett Rolfson and Monte Manning as inventors, and which is now U.S. Pat. No. 5,825,074 the disclosure of which is incorporated by reference. That patent resulted from a divisional application of U.S. patent application Ser. No. 08/528,124, filed Sep. 14, 1995, entitled "Method of Making a Resistor" naming J. Brett Rolfson and Monte Manning as inventors, and which is now U.S. Pat. No. 5,567,644.

TECHNICAL FIELD

This invention relates generally to semiconductor processing methods of forming resistors and diodes from semiconductive material, and to static random access memory (SRAM) cells incorporating resistors, and to other integrated circuitry incorporating resistors and diodes.

BACKGROUND OF THE INVENTION

One of the common elements required in electrical circuit devices is the pull-up or pull-down resistor from an active device to one of the power supply buses, typically referred to as Vcc. The pull-up is simple if used to construct a circuit using discrete components in that all that is required is selecting a resistor of the desired resistance and tolerance, connecting it between an active device such as an open collector transistor and Vcc, and the transistor's output would be pulled up to Vcc once the transistor is forward biased. With the advent of integrated circuitry, however, fabricating a resistance onto a wafer substrate, such as silicon or gallium arsenide, takes special consideration, particularly when resistivity and tolerances play an important part in circuit operation.

For example, as SRAMs have evolved from the 4 Kb memory arrays to more densely packed array sizes, tolerances of pull-up resistances had to be tightly controlled. In order to minimize standby current, many fabrications processes adopted use an active device as the pull-up. In CMOS fabrication, it is common to see a PMOS transistor acting as the current path between a memory cell access transistor and the power supply bus. In this manner, the PMOS transistor can be gated "on" only when the desired line is to be pulled up to Vcc and turned "off" otherwise. This in essence eliminates leakage current and minimizes standby current for the SRAM device as a whole.

The main drawback to using an active device for a pull-up device is the amount of space required to fabricate the device. Now that the SRAM generation has grown to the 1 Mb array size, die space is a critical factor to consider. Technology had basically pushed all types of integrated circuits to be more densely packed, and pull-ups are a common element in many circuit designs.

Although the invention primarily arose out of concerns associated with resistor fabrication in SRAM circuitry, the artisan will appreciate applicability of the inventive technology elsewhere, with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts " (Article 1, Section 8).

The invention includes several aspects of forming resistor and diode constructions. The invention also includes several aspects of SRAM and other integrated circuitry incorporating diodes and resistors produced according to the inventive methods, and produced according to other methods.

Figure 1:
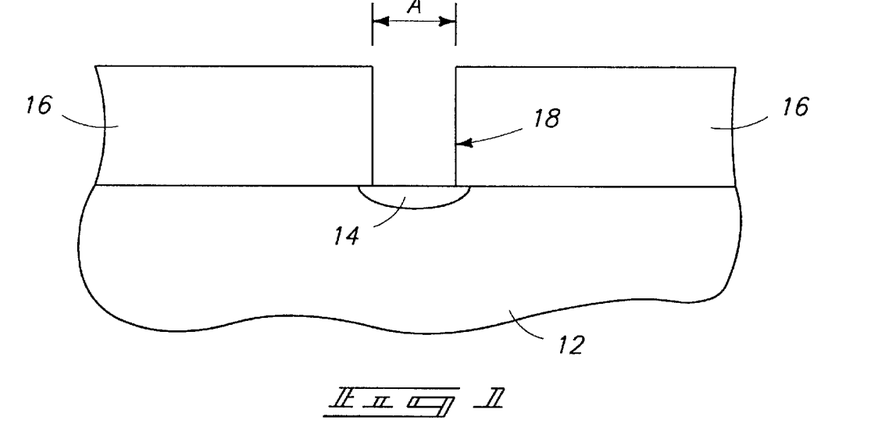
FIG. 1 is a diagrammatic cross-sectional view of a semiconductor wafer fragment at one processing step in accordance with the invention.

A semiconductor processing method of forming a resistor construction from semiconductive material is first described with reference to FIG. 1. Such illustrates a bulk semiconductor substrate 12, such as a monocrystalline silicon, having a conductive diffusion region 14 formed therein. Region 14 constitutes a node to which electrical connection to a resistor is to be made. An electrically insulative layer 16, typically borophosphosilicate glass (BPSG), is provided outwardly relative to node 14. A first opening 18, preferable in the configuration of a substantially vertical passageway, is provided therethrough over node 14. First opening 18 has an opening width "A". Node 14 can be provided before provision layer 16 and opening 18, or after provision of layer 16 and opening 18.

Figure 2:
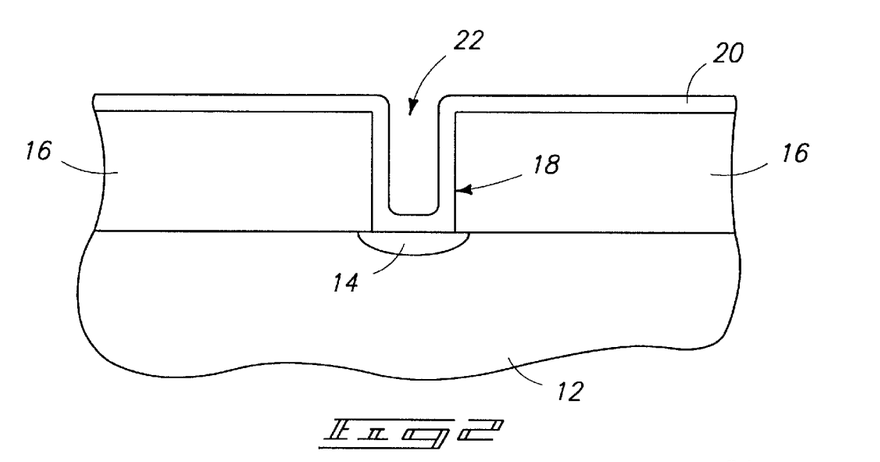
FIG. 2 is a view of the FIG. 1 wafer fragment at a processing step subsequent to that shown by FIG. 1.

Referring to FIG. 2, a first layer 20 of semiconductive material is chemical vapor deposited over electrically insulative layer 16 and within first opening 18 over node 14 to a thickness which is less than one-half first opening width "A" to less than completely fill first opening 18 with semiconductive material. Such thereby defines a remaining opening 22. An example semiconductive material of first layer 20 is silicon, such as amorphously deposited silicon or polycrystalline silicon. During or after deposition, first layer 20 can be provided with a first conductivity enhancing dopant impurity of a first "p" or "n" type. Layer 20 can also remain undoped at this point in the process. Accordingly, semiconductive material layer 20 has a first conductivity enhancing dopant concentration falling within a range of from 0 to some first value, with the first value typically being less than $1 \times 10^{18}$ ions/cm$^3$. Greater values, such as $1 \times 10^{20}$ ions/cm$^3$, would effectively inherently make layer 20 undesirably sufficiently electrically conductive to provide negligible resistance effect.

Figure 3:
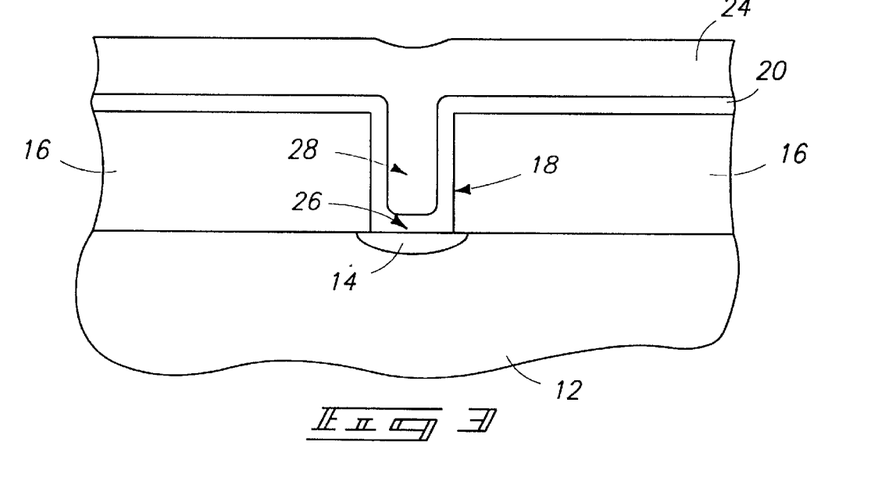
FIG. 3 is a view of the FIG. 1 wafer fragment at a processing step subsequent to that shown by FIG. 2.

Referring to FIG. 3, a second layer 24 of semiconductive material is provided by chemical vapor deposition, or other technique, to within remaining opening 22 and inside of first layer 20 to completely fill remaining opening 22 with semiconductive material. Thus, opening 18 is likewise completely filled with semiconductive material. Second layer 24 is provided in one example with a second conductivity dopant concentration which is greater than the first concentration. Thus, a conductivity enhancing impurity concentration gradient is provided within opening 18 which varies from a low concentration at an inner elevation 26 within opening 18 to a higher concentration at an outer elevation 28 within opening 18.

The conductivity enhancing dopants provided in first and second layers 20 and 24 can comprise the same or different conductivity "n" or "p" types. Further even if of the same type, the dopants might be different, for example one being arsenic and one being phosphorus which are both "n" type. When of the same type, the semiconductive material effectively filling opening 18 defines a substantially vertically elongated resistor within opening/passageway 18, which is an ohmic electrical contact with node 14. Where the conductivity enhancing dopants provided in first and second layers 20 and 24, respectively, are of different type, the result will be formation of a substantially vertically elongated diode provided within passageway 18 and in ohmic electrical contact with node 14. The diode will effectively comprise two regions 20 and 24 of semiconductive material which in combination completely fill passageway 18.

In such instance, it may be desirable to provide each of regions/layers 20 and 24 with about the same concentration level of dopant impurity, and at greater than $1 \times 10^{20}$ ions/cm$^3$, to form a highly conductive diode. Alternatively, it might be desirable to provide the two regions/layers with different type and different concentration level dopant impurities to effectively define a leaking or leaky diode, which then effectively functions as a resistor. Accordingly, in one aspect of the invention, a leaky diode construction also constitutes a vertically elongated resistor within opening 18.

Figure 4:
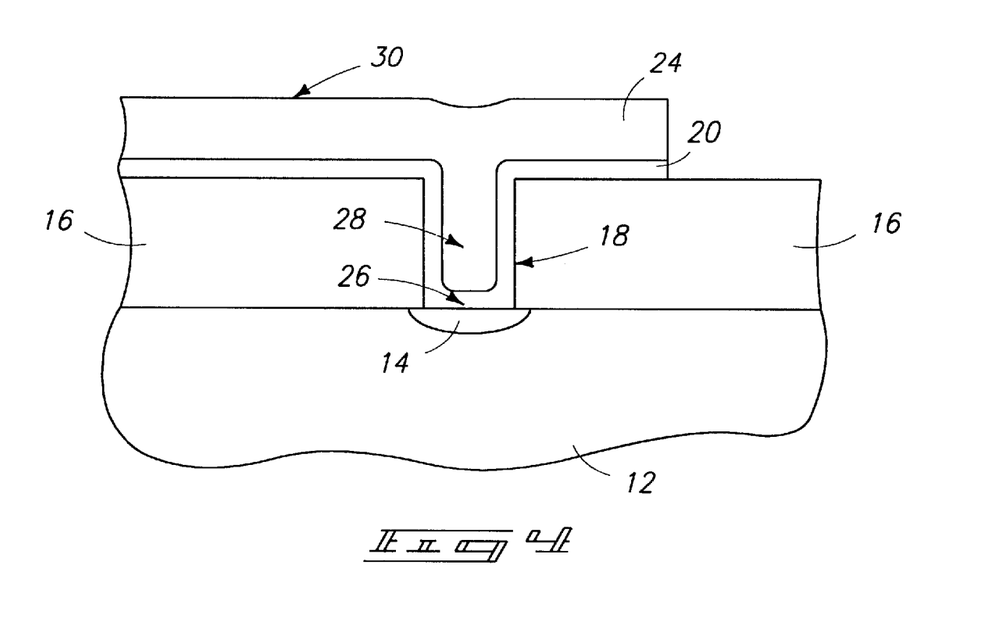
FIG. 4 is a view of the FIG. 1 wafer fragment at a processing step subsequent to that shown by FIG. 3.

Ultimately, an outer layer of electrically conductive material is provided outwardly of insulating layer 16 and patterned into a conductive line, with the elongated resistor or diode extending between node 14 and the formed conductive line. Such might be accomplished by a number of methods. For example, the construction of FIG. 3 could be etched back by chemical mechanical polishing, or other means, back to the upper surface of insulating layer 16. Subsequently, a metal or other highly conductive material can be deposited and patterned to form a line. More preferably, second layer 24 of semiconductive material is provided to have a dopant concentration which is at least $1 \times 10^{20}$ ions/cm$^3$ and is deposited to a sufficient thickness to enable it to be patterned into a conductive line 30 (FIG. 4). Accordingly in such instance, conductive line 30 comprises both first and second layers 20 and 24, with outer layer 24 forming a highly conductive part thereof. A silicide layer, such as WSi$_x$ (not shown), might also be provided outwardly of layer 24. In either event, the formed diode or resistor extends between node 14 and patterned conductive line 30. Processing in accordance with the above described preferred method provides the advantage of provision of a line and diode or resistor without added masking steps for the resistor or diode.

Alternate techniques are contemplated for provision of substantially elongated vertically oriented resistors or diodes which fill opening/passageway 18. For example in provision of a resistor, opening/passageway 18 might be filled in a substantially continuous chemical vapor deposition step. During such deposition, the conductivity enhancing impurity would be provided to the reactor at a rate varying from, for example, a first lower rate to a second higher rate such that the outermost portion of the deposited layer has the desired high conductivity attributes, whereas lower resions have the desired resistive attributes. The final resultant rate could be provided to produce a dopant concentration at the outer regions of the deposited layer which is at least $1 \times 10^{20}$ ions/cm$^3$ to facilitate production of a desired highly conductive line outwardly of insulating layer 16.

A similar process could be utilized for formation of a diode. For example, a substantially continuous chemical vapor depositing step could be utilized to fill passageway/opening 18 and provide a layer thickness outwardly of insulating layer 16 sufficient for formation of a conductive line, and define an elongated diode within the passageway. For example, the chemical vapor depositing step could include first feeding a conductivity enhancing impurity of a first step into the reactor during deposition to provide semiconductive material of the first conductivity type at an inner elevation within the opening. During deposition, the dopant feed to the reactor would be changed from the first feeding to a second feeding of a conductivity enhancing impurity of a second type to provide semiconductive material of the second conductivity type at an outer elevation within the opening. Subsequent provision of a conductive metal line by mere patterning, or by provision of other conductive layers and patterning, could be provided.

Alternatively in formation of a resistor, semiconductive material might be deposited atop insulating layer 16 and within opening 18 to be inherently undoped or very lightly doped as-deposited. Subsequently, a conductivity enhancing dopant impurity might be driven into the semiconductive material layer at least outwardly of the electrically insulative layer to a peak concentration of greater than or equal to $1 \times 10^{20}$ ions/cm$^3$. Subsequently, this semiconductive material layer would be exposed to annealing conditions effective to diffuse dopant impurity within the semiconductive material from outwardly of the electrically insulative layer into the semiconductive material within the opening to effectively form an elongated resistor in ohmic contact with node 14. The semiconductive material layer outwardly of the electrically insulative layer would thereafter be patterned into a conductive line, with the elongated resistor extending between node 14 and the conductive line. Example annealing conditions include 950° C. for 20 seconds in an N$_2$ atmosphere. Alternately, the wafer might be exposed to sufficient thermal conditions throughout processing to inherently provide such desired dopant driving to deep within passageway 18.

For diode formation, as alternate process is also contemplated. Specifically, a dingle semiconductive material layer can be chemically deposited to within opening 18 and over layer 16 to completely fill such opening. As deposited, the semiconductive material layer would be provided with conductivity enhancing dopant impurity of a first type having an average concentration of about $1 \times 10^{18}$ ions/cm$^3$. After the chemical vapor depositing step, a conductivity enhancing dopant impurity of a second type can be provided into the outermost portions of the deposited layer by ion implementation to a peak and overwhelming concentration of at least $1 \times 10^{20}$ ions/cm$^3$. The substrate is then exposed to annealing conditions effective to diffuse second type dopant impurity within the semiconductive material from outwardly of the electrically insulative layer into the first type semiconductive material within opening 18 to effectively form an elongated diode within the opening.

Integrated circuitry incorporating the above constructions whereby a substantially vertically elongated resistor or diode extends between a node and an outer conductive line is also contemplated.

Figure 5:
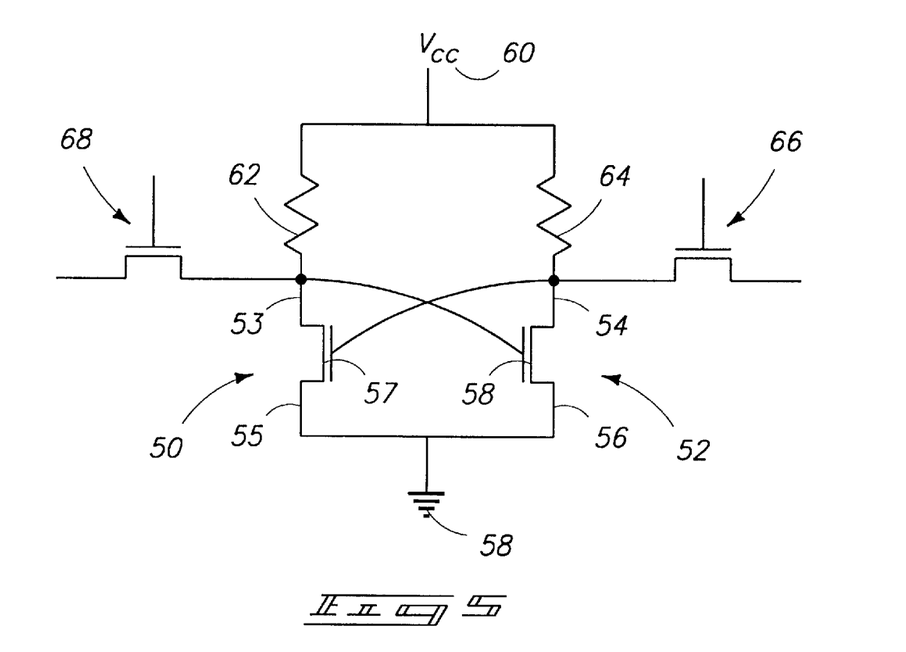
FIG. 5 is a schematic representation of SRAM circuitry in accordance with an aspect of the invention.

FIG. 5 schematically illustrates one example integrated circuitry of an SRAM cell in accordance with the invention utilizing at least one of the subject resistors. Such comprises a pair of first and second pull-down transistors 50 and 52, respectively. These include respective drains 53, 54; respective sources 55, 56; and respective gates 57, 58. Gates 57 of first pull-down transistor 50 is electrically coupled to drain 54 of second pull-sown transistor 52. Likewise, gate 58 of second pull-down transistor 52 is electrically coupled to drain 53 of first pull-down transistor 50. A ground node 58 and a Vcc node 60 are provided. A first resistor 62 and a second resistor 64 electrically are coupled with Vcc node 60 via a patterned line. Drain 53 of first pull-down transistor 50 electrically couples with Vcc node 60 through first resistor 62. Drain 54 of second pull-down transistor 52 electrically couples through second resistor 64 to Vcc node 60. A pair of cell access transistors 66 and 68 are also provided.

In the context of the previously described construction, the described and illustrated resistor/leaking diode would constitute one or both of resistors 62 and 64. Node 14 would constitute one of drains 53 or 54. Node 14 could alternately be the outer surface of gate 57 or gate 58. Patterned line 30 would be configured to extend to the suitable power Vcc node.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An SRAM cell comprising:
a pull down transistor having a drain;
a Vcc node;
a resistor electrically coupled with the Vcc node;
the drain of the pull down transistor being electrically coupled through the resistor to the Vcc node; and
the resistor comprising:
an electrically insulative layer lying outwardly of the drain of the pull down transistor, the insulative layer having an opening defined therethrough to the pull down transistor drain; and
an elevationally elongated resistor within the opening and being in ohmic electrical contact with the pull down transistor drain, the resistor comprising two regions of semiconductive material having different conductivities and comprising portions which extend both elevationally longitudinal within the opening and laterally proximate one another, the elevationally elongated resistor being elevationally longer than it is wide within the opening; and
an outer conductive Vcc line of electrically conductive material overlying the resistor and extending to Vcc, the Vcc line being in ohmic electrical contact with the resistor, the resistor extending between the conductive line and the pull down transistor drain.

2. An SRAM cell comprising:
a pull down transistor having a drain;
a Vcc node;
a resistor electrically coupled with the Vcc node;
the drain of the pull down transistor being electrically coupled through the resistor to the Vcc node; and
the resistor comprising:
an electrically insulative layer lying outwardly of the drain of the pull down transistor, the insulative layer having an opening defined therethrough to the pull down transistor drain; and
an elongated resistor within the opening and being in ohmic electrical contact with the pull down transistor drain, the resistor comprising two regions of semiconductive material having different conductivities and comprising portions which extend both longitudinally within the opening and laterally proximate one another, the two regions having different conductivity type dopant impurity and different average impurity concentrations; and
an outer conductive Vcc line of electrically conductive material overlying the resistor and extending to Vcc, the Vcc line being in ohmic electrical contact with the resistor, the resistor extending between the conductive line and the pull down transistor drain.

3. An SRAM cell comprising:
a pull down transistor having a drain;
a Vcc node;
a resistor electrically coupled with the Vcc node;
the drain of the pull down transistor being electrically coupled through the resistor to the Vcc node; and
the resistor comprising:
an electrically insulative layer lying outwardly of the drain of the pull down transistor, the insulative layer having an opening defined therethrough to the pull down transistor drain; and
an elongated resistor within the opening and being in ohmic electrical contact with the pull down transistor drain, the resistor comprising two regions of semiconductive material having different conductivities and comprising portions which extend both longitudinally within the opening and laterally proximate one another, the two regions having different conductivity type dopant impurity; and
an outer conductive Vcc line of electrically conductive material overlying the resistor and extending to Vcc, the Vcc line being in ohmic electrical contact with the resistor, the resistor extending between the conductive line and the pull down transistor drain.

4. An SRAM cell comprising:
a pull down transistor having a drain;
a Vcc node;
a resistor electrically coupled with the Vcc node;
the drain of the pull down transistor being electrically coupled through the resistor to the Vcc node; and
the resistor comprising:
an electrically insulative layer lying outwardly of the drain of the pull down transistor, the insulative layer having an opening defined therethrough to the pull down transistor drain; and
an elevationally elongated resistor within the opening and being in ohmic electrical contact with the pull down transistor drain, the resistor comprising two regions of semiconductive material having different conductivities and comprising portions which extend both elevationally longitudinal within the opening and laterally proximate one another, the two regions having different average conductivity enhancing impurity concentrations, the elevationally elongated resistor being elevationally longer than it is wide within the opening, the two regions of semiconductive material of the resister overfilling the opening; and
an outer conductive Vcc line of electrically conductive material overlying the resistor and extending to Vcc, the Vcc line being in ohmic electrical contact with the resistor, the resistor extending between the conductive line and the pull down transistor drain.

5. Integrated circuitry comprising:

an opening defining a wall within an electrically insulative layer to a node, the opening having a base; and an elongated resistor within the opening and in electrical contact with the node, the resistor comprising a plurality of different regions of silicon semiconductive material disposed within the opening, the regions having different conductivities, one of the regions being defined by a first layer having a single-type of dopant impurity therein, the layer comprising a portion laterally proximate the entire length of the wall, and another portion over the entirety of the bottom of the opening, another of the regions being defined by a second layer comprising a portion laterally proximate the one region portion which is laterally proximate the wall, both portions of the first layer having a generally uniform conductivity.

6. Integrated circuitry comprising:

an opening within an electrically insulative layer to a node; and an elongated diode within the opening and being in ohmic electrical contact with the node, the diode comprising two regions of silicon semiconductive material which in combination completely fill the opening, the regions comprising portions which extend away from the node both longitudinally within the opening and laterally proximate one another, one of the regions being conductively doped with a conductivity enhancing impurity of a first type, the other of the regions being conductively doped with a conductivity enhancing impurity of a second type.

7. An SRAM cell comprising:

a pull down transistor having a drain;

a Vcc node;

a resistor electrically coupled with the Vcc node;

the drain of the pull down transistor being electrically coupled through the resistor to the Vcc node; and the resistor comprising:
    an electrically insulative layer lying outwardly of the drain of the pull down transistor, the insulative layer having an opening defined therethrough to the pull down transistor drain; and
    an elongated resistor within the opening and being in ohmic electrical contact with the pull down transistor drain, the resistor comprising two regions of silicon semiconductive material having different conductivities and comprising portions which extend both longitudinally within the opening and laterally proximate one another; and
    an outer conductive Vcc line of electrically conductive material overlying the resistor and extending to Vcc, the Vcc line being in ohmic electrical contact with the resistor, the resistor extending between the conductive line and the pull down transistor drain, wherein the outer conductive line comprises the semiconductive material, but having an average dopant impurity concentration of greater than or equal to about $1 \times 10^{20}$ ions/cm$^3$.

8. An SRAM cell comprising:

a pull down transistor having a drain;

a Vcc node;

a resistor electrically coupled with the Vcc node;

the drain of the pull down transistor being electrically coupled through the resistor to the Vcc node; and the resistor comprising:
    an electrically insulative layer lying outwardly of the drain of the pull down transistor, the insulative layer having an opening defined therethrough to the pull down transistor drain; and
    an elongated resistor within the opening and being in ohmic electrical contact with the pull down transistor drain, the resistor comprising two regions of silicon semiconductive material having different conductivities and comprising portions which extend both longitudinally within the opening and laterally proximate one another; and
    an outer conductive Vcc line of electrically conductive material overlying the resistor and extending to Vcc, the Vcc line being in ohmic electrical contact with the resistor, the resistor extending between the conductive line and the pull down transistor drain, wherein the semiconductive material has an average conductivity enhancing dopant impurity concentration of less than or equal to about $5 \times 10^{18}$ ions/cm$^3$.

9. An SRAM cell comprising:

a pull down transistor having a drain with a generally planar uppermost surface;

a Vcc node; and a resistor electrically coupled with the Vcc mode, the resistor comprising:
    an electrically insulative layer lying outwardly of the drain of the pull down transistor, the insulative layer having an opening formed therethrough to the pull down transistor drain; and
    an elevationally elongated resistor within the opening and being in ohmic electrical contact with the pull down transistor drain, the resistor comprising first and second elongated semiconductive material portions disposed next to one another in a direction generally parallel with the drain's uppermost surface, and being elongate in directions generally normal from the drain's uppermost surface, the elevationally elongated resistor being elevationally longer than it is wide within the opening, the two semiconductive material portions of the resistor overfilling the opening.

10. An SRAM cell comprising:

a pull down transistor having a drain;

a Vcc node;

a resistor electrically coupled with the Vcc node;

the drain of the pull down transistor being electrically coupled through the resistor to the Vcc node; and the resistor comprising:
    an electrically insulative layer lying outwardly of the drain of the pull down transistor, the insulative layer having an opening defined therethrough to the pull down transistor drain; and
    an elongated resistor within the opening and being in ohmic electrical contact with the pull down transistor drain, the resistor comprising two regions of semiconductive material having different conductivities and comprising portions which extend both longitudinally within the opening and laterally proximate one another, the two regions having different average conductivity enhancing impurity concentrations; and
    an outer conductive Vcc line of electrically conductive material overlying the resistor and extending to Vcc, the Vcc line being in ohmic electrical contact with the resistor, the resistor extending between the conductive line and the pull down transistor drain, the Vcc line at least as received over the pull down transistor drain consisting essentially of material of said two regions of semiconductive material.

11. An SRAM cell comprising:

a pull down transistor having a drain with a generally planar uppermost surface;

a Vcc node; and a resistor electrically coupled with the Vcc node, the resistor comprising:
an electrically insulative layer lying outwardly of the drain of the pull down transistor, the insulative layer having an opening formed therethrough to the pull down transistor drain; and
an elongated resistor within the opening and being in ohmic electrical contact with the pull down transistor drain, the resistor comprising first and second elongate silicon semiconductive material portions disposed next to one another in a direction generally parallel with the drain's uppermost surface, and being elongate in directions generally normal from the drain's uppermost surface, the first and second elongate silicon semiconductive material portions of the resistor overfilling the opening.

12. An SRAM cell comprising:

a pull down resistor having a drain;

a Vcc node;

a resistor electrically coupled with the Vcc node;

the drain of the pull down transistor being electrically coupled through the resistor to the Vcc node; and the resistor comprising:
an electrically insulative layer lying outwardly of the drain of the pull down transistor, the insulative layer having an opening defined therethrough to the pull down transistor drain; and
an elevationally elongated resistor within the opening and being in ohmic electrical contact with the pull down transistor drain, the resistor comprising two regions of semiconductive material having different conductivities and comprising portions which extend both elevationally longitudinal within the opening and laterally proximate one another, the two regions having different average conductivity enhancing impurity concentrations, the elevationally elongated resistor being elevationally longer than it is wide within the opening; and
an outer conductive Vcc line of electrically conductive material overlying the resistor and extending to Vcc, the Vcc line being in ohmic electrical contact with the resistor, the resistor extending between the conductive line and the pull down transistor drain.

13. An SRAM cell comprising:

a pull down transistor having a drain with a generally planar uppermost surface;

a Vcc node; and a resistor electrically coupled with the Vcc node, the resistor comprising:
an electrically insulative layer lying outwardly of the drain of the pull down transistor, the insulative layer having an opening formed therethrough to the pull down transistor drain; and
an elevationally elongated resistor within the opening and being in ohmic electrical contact with the pull down transistor drain, the resistor comprising first and second elongate semiconductive material portions disposed next to one another in a direction generally parallel with the drain's uppermost surface, and being elongate in directions generally normal from the drain's uppermost surface, the elevationally elongated resistor being elevationally longer than it is wide within the opening.

14. The SRAM cell of claim 3 wherein one region of the two regions is more proximate the insulative layer than another region of the two regions, the one region having lower conductivity enhancing dopant concentration than the other region.

15. The SRAM cell of claim 4 wherein one region of the two regions is more proximate the insulative layer than another region of the two regions, the one region having lower conductivity enhancing dopant concentration than the another region.

16. Integrated circuitry according to claim 5 wherein the two regions have different conductivity type dopant impurity and different average impurity concentrations.

17. Integrated circuitry according to claim 6 wherein the two regions have about the same dopant impurity concentration.

18. Integrated circuitry according to claim 6 wherein the two regions have different dopant impurity concentrations.

19. The integrated circuitry of claim 5 wherein the semiconductive material that the resistor comprises has an average conductivity enhancing dopant impurity concentration of less than or equal to about $5 \times 10^{18}$ ions/cm$^3$.

20. The integrated circuitry of claim 19 further comprising an outer conductive line of electrically conductive material overlying the resistor, the line being in ohmic electrical contact with the resistor, the resistor extending between the node and the conductive line.

21. The integrated circuitry of claim 20 wherein the outer conductive line comprises the semiconductive material and has average dopant impurity concentration of greater than or equal to about $1 \times 10^{20}$ ions/cm$^3$.

22. The integrated circuitry of claim 6 further comprising an outer conductive line of electrically conductive material overlying the diode, the line being in ohmic electrical contact with the diode, the diode extending between the node and the conductive line.

23. The integrated circuitry of claim 22 wherein the outer line comprises one of the regions of conductivity doped semiconductive material.

24. The integrated circuitry of claim 5 wherein the opening is a substantially vertical passageway and wherein the resistor is substantially elongated within the passageway.

25. The integrated circuitry of claim 6 wherein the opening is a substantially vertical passageway and wherein the diode is substantially elongated within the passageway.

26. The SRAM of claim 9 wherein the opening is a substantially vertical passageway and wherein the resistor is substantially elongated within the passageway.

27. The SRAM cell of claim 1 wherein the two regions of semiconductive material of the resistor overfill the opening.

28. The SRAM cell of claim 2 wherein the two regions of semiconductive material of the resistor overfill the opening.

29. The SRAM cell of claim 3 wherein the two regions of semiconductive material of the resistor overfill the opening.

30. The SRAM cell of claim 10 wherein the two regions of semiconductive material of the resistor overfill the opening.

* * * * *

UNITED STATES PATENT AND TRADEMARK OFFICE
CERTIFICATE OF CORRECTION

PATENT NO. : 6,340,834 B1
DATED : January 22, 2002
INVENTOR(S) : J. Brett Rolfson et al.

It is certified that error appears in the above-identified patent and that said Letters Patent is hereby corrected as shown below:

Column 3,
Line 64, replace "whereas lower resions" with -- whereas lower regions --

Column 4,
Line 11, replace "first step into the reactor during" with -- first type into the reactor during --
Line 21, replace "Alternatively in formation of a resistor," with -- Alternately in formation of a resistor, --
Line 43, replace "For diode formation, as alternate process is" with -- For diode formation, an alternate process is --
Line 44, replace "plated. Specifically, a dingle semiconductive" with -- plated. Specifically, a single semiconductive --
Line 65, replace "illustrates one example integrated" with -- illustrates on example of integrated --

Column 5,
Line 5, replace "54 of second pull-sown transistor 52." with -- 54 of second pull-down transistor 52. --

Column 9,
Line 27, replace " a pull down resistor having a drain;" with -- a pull down transistor having a drain; --

UNITED STATES PATENT AND TRADEMARK OFFICE
CERTIFICATE OF CORRECTION

PATENT NO. : 6,340,834 B1
DATED : January 22, 2002
INVENTOR(S) : J. Brett Rolfson et al.

It is certified that error appears in the above-identified patent and that said Letters Patent is hereby corrected as shown below:

<u>Column 10,</u>
Line 13, replace "other region." with -- another region. --
Line 46, replace "line comprises one of the regions of conductivity" with
-- line comprises one of the regions of conductively --

Signed and Sealed this

Twenty-second Day of October, 2002

*Attest:*

*Attesting Officer*

JAMES E. ROGAN
*Director of the United States Patent and Trademark Office*